US009729163B1

(12) United States Patent
Song et al.

(10) Patent No.: US 9,729,163 B1
(45) Date of Patent: Aug. 8, 2017

(54) APPARATUS AND METHOD FOR IN SITU ANALOG SIGNAL DIAGNOSTIC AND DEBUGGING WITH CALIBRATED ANALOG-TO-DIGITAL CONVERTER

(71) Applicant: QUALCOMM Incorporated, San Diego, CA (US)

(72) Inventors: Deqiang Song, San Diego, CA (US); Xiaohua Kong, San Diego, CA (US); Bupesh Pandita, Raleigh, NC (US); Zhuo Gao, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/251,861

(22) Filed: Aug. 30, 2016

(51) Int. Cl.
H03M 1/06 (2006.01)
H03M 1/10 (2006.01)
H03M 1/12 (2006.01)

(52) U.S. Cl.
CPC ........... *H03M 1/1028* (2013.01); *H03M 1/12* (2013.01)

(58) Field of Classification Search
None
See application file for complete search history.

(56) References Cited

U.S. PATENT DOCUMENTS

| | | | |
|---|---|---|---|
| 4,677,581 A * | 6/1987 | Malka | G01R 31/2841 341/118 |
| 5,969,653 A * | 10/1999 | Sachdev | H03M 1/108 341/118 |
| 6,408,412 B1 | 6/2002 | Rajsuman | |
| 6,608,582 B2 * | 8/2003 | Casper | H03F 3/45183 341/118 |
| 6,950,046 B2 | 9/2005 | Luo et al. | |
| 7,138,820 B2 * | 11/2006 | Goetting | G01R 31/3167 326/38 |
| 7,650,248 B1 | 1/2010 | Baxter | |
| 8,099,252 B2 | 1/2012 | Warren et al. | |
| 8,299,802 B2 * | 10/2012 | Wong | G01R 31/3167 324/537 |
| 8,659,309 B2 | 2/2014 | Ouslis et al. | |
| 2007/0035321 A1 * | 2/2007 | Gorodetsky | G01R 31/3167 324/750.3 |

* cited by examiner

*Primary Examiner* — Howard Williams
(74) *Attorney, Agent, or Firm* — Loza & Loza, LLP/Qualcomm

(57) ABSTRACT

An integrated circuit (IC) chip includes an on-chip analog signal monitoring circuit for monitoring a set of analog signals generated by one or more mixed signal cores within the IC chip, converting the analog signals into digital signals, storing the digital signals in an on-chip memory, and providing the digital signals to a test equipment upon request. The analog signal monitoring signal includes an on-chip reference generator for generating precise voltages and/or currents, a switching network for routing a selected reference signal to an analog-to-digital converter (ADC) for calibration purpose and for routing a selected analog signal from one of the mixed signal cores to the ADC for digitizing purposes. The IC chip further includes an on-chip memory for storing the digitized analog signals for subsequent accessing by a test equipment for analysis. The IC chip includes a digital analog test point (ATP) for outputting the digitized analog signals.

30 Claims, 6 Drawing Sheets

APPARATUS AND METHOD FOR IN SITU ANALOG SIGNAL DIAGNOSTIC AND DEBUGGING WITH CALIBRATED ANALOG-TO-DIGITAL CONVERTER

BACKGROUND

Field

Aspects of the present disclosure relate generally to diagnostic and debugging of integrated circuits (ICs), and in particular, to an apparatus and method for in situ or on-chip analog signal diagnostic and debugging with calibrated analog-to-digital converter.

Background

An integrated circuit (IC) chip or die sometimes includes a set of analog or mixed (analog and digital) signal cores. For example, such IC chip may include a Universal Serial Bus (USB) physical interface (USB PHY) core, a Personal Component Interconnect Express (PCIe) physical interface (PCIe PHY) core, and a Universal Flash Storage (UFS) physical interface (UFS PHY) core. Each of these cores may generate a set of one or more analog signals that need to be monitored for testing, debugging, optimizing, circuit robustness, operational verification, and/or other purposes.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including an integrated circuit (IC). The IC includes a first core configured to generate a first set of one or more analog signals; a reference generator configured to generate a set of one or more reference signals; an analog-to-digital converter (ADC) configured to generate a digital signal based on a selected one of the first set of one or more analog signals; and a switching network configured to selectively route a selected one of the set of one or more reference signals to the ADC for calibrating the ADC, and selectively route the selected one of the first set of one or more analog signals to the ADC for generating the digital signal.

Another aspect of the disclosure relates to a method of monitoring an analog signal. The method includes generating an analog signal within a first core of an integrated circuit (IC) chip; generating a reference signal within a second core of the IC chip; and generating a digital signal within the IC chip based on the analog signal and the reference signal.

Another aspect of the disclosure relates to an apparatus including means for generating an analog signal within a first core of an integrated circuit (IC) chip; means for generating a reference signal within a second core of the IC chip; and means for generating a digital signal within the IC chip based on the analog signal and the reference signal.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Many integrated circuit (IC) chips (also known as "IC dies") include analog or mixed (digital and analog) signal cores, each configured to produce a set of one or more analog signals. Such analog signals may include direct current (DC) signals, as well as low frequency analog signals. Often during prototyping phase, these analog signals need to be monitored to diagnose the corresponding core, to test the fundamental of the design, and for design optimization and robustness purposes. An example of such IC is described below.

Figure 1:
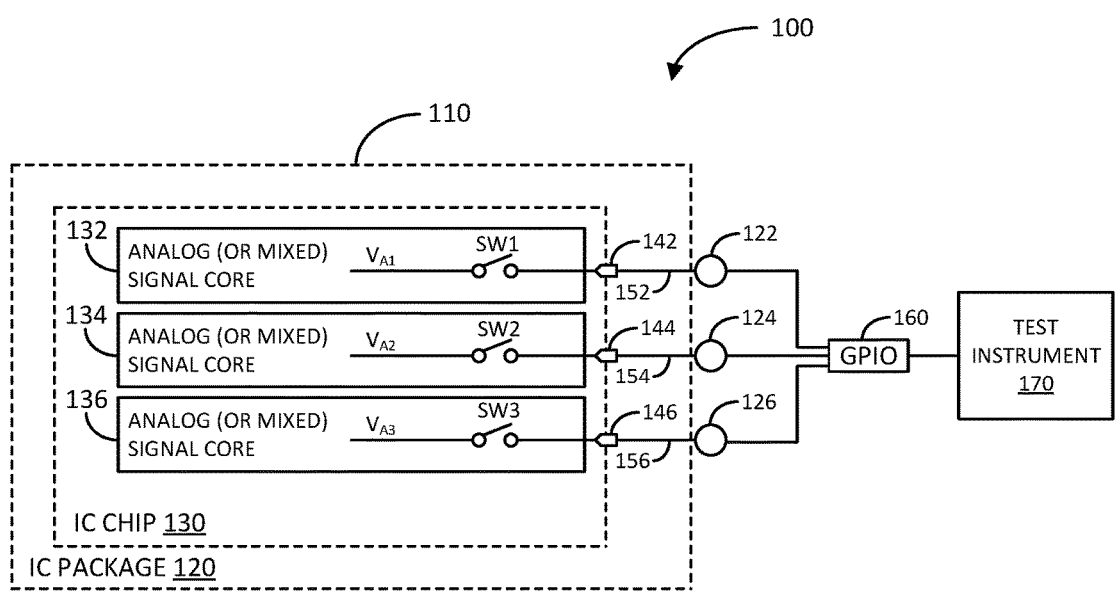
FIG. 1 illustrates a diagram depicting an exemplary testing system in accordance with an aspect of the disclosure.

FIG. 1 illustrates a diagram depicting an exemplary testing system 100 in accordance with an aspect of the disclosure. The testing system 100 includes an IC 110, as a device-under-test (DUT), having an IC chip 130 situated within an IC package 120. In this example, the IC chip 130 includes a set of analog or mixed signal cores 132, 134, and 136. For example, one of the cores may be a Universal Serial Bus (USB) physical interface (USB PHY), another one of the cores may be a Personal Component Interconnect Express (PCIe) physical interface (PCIe PHY), and yet another one of the cores may be a Universal Flash Storage (UFS) physical interface (UFS PHY).

Each of the analog or mixed signal cores 132, 134, and 136 is configured to produce a set of one or more analog signals (e.g., DC, low frequency signals, bias conditions, currents, and voltages). One or more of the analog signals of each of the cores 132, 134, and 136 may be selectively outputted for testing, debugging, optimizing, and/or other purposes. For instance, the analog or mixed signal core 132 may selectively output a set of one or more analog signals (collectively referred to as $V_{A1}$) via switch SW1 to a solder bump 142 of the IC chip 130. Similarly, the analog or mixed signal core 134 may selectively output another set of one or more analog signals (collectively referred to as $V_{A2}$) via switch SW2 to a solder bump 144 of the IC chip 130. And, the analog or mixed signal core 136 may selectively output a set of one or more analog signals (collectively referred to as $V_{A3}$) via switch SW3 to a solder bump 146 of the IC chip 130.

The IC package 120 may include a set of ball grid array (BGA) balls 122, 124, and 126 coupled to the solder bumps 142, 144, and 146 of the analog or mixed signal cores 132, 1134, and 136 via package interconnects 152, 154, and 156, respectively. The set of analog signals $V_{A1}$, $V_{A2}$, and $V_{A3}$ from the cores 132, 134, and 1136 are routed to the BGA balls 122, 124, and 126 via the interconnects 152, 154, and 156 for testing, diagnostic, debugging, optimizing and/or other purposes, respectively. Accordingly, the BGA balls 122, 124, and 126 serve as analog test points (ATPs) for the IC 110.

A testing instrument 170 may be selectively coupled to each of the BGA balls 122, 124, and 126 via a General-Purpose Input/Output (GPIO) interface 160 (e.g., connector and cable) to selectively provide each set of the analog signals $V_{A1}$, $V_{A2}$, and $V_{A3}$ to the test instrument. During prototyping of the IC 110, the sets of analog signals $V_{A1}$, $V_{A2}$, and $V_{A3}$ from the cores 132, 134, and 1136 are analyzed by the testing instrument 170 to make sure the signals are aligned and induce robust performance of the IC 110. In final commercial products, the sets of analog signals $V_{A1}$, $V_{A2}$, and $V_{A3}$ may be analyzed by the testing instrument 170 to trouble shoot the IC 110 in the field.

There are several drawbacks to the IC 110. First, in production ICs, it may not be desirable for customers to have access to the set of analog signals $V_{A1}$, $V_{A2}$, and $V_{A3}$ via the BGA balls 122, 124, and 126 for confidential and/or proprietary reasons. Further, there is a cost in terms of IC package area to implement interconnects 152, 154, and 156 and BGA balls 122, 124, and 126 to output the sets of analog signals $V_{A1}$, $V_{A2}$, and $V_{A3}$ for testing purposes. Reducing, or even eliminating, the number of package interconnects and BGA balls for testing purposes may allow for better use of the IC package area.

In summary, an aspect of the disclosure is to create an on-chip solution to monitor analog signals from one or more analog or mixed signal cores. By creating the on-chip solution, the number of BGA balls as well as package interconnects used for analog signal testing purposes may be reduced or even eliminated, which facilitates the reduction in size of the IC chip and package, and/or allows for the area to be used for other purposes.

In another aspect, the on-chip analog signal monitoring solution converts the analog signals from the analog or mixed signal cores into digital signals for storage in a memory core on the IC chip. In this aspect, the on-chip analog signal monitoring solution facilitates the testing of the cores in the field. A testing instrument, for example, running diagnostic software, may connect to a test interface circuit within the IC chip to access the stored data of the analog signals for testing, monitoring, diagnostic, debugging, optimizing and/or other purposes.

The on-chip analog signal monitoring solution is described below in more detail with reference to various exemplary implementations.

Figure 2A:
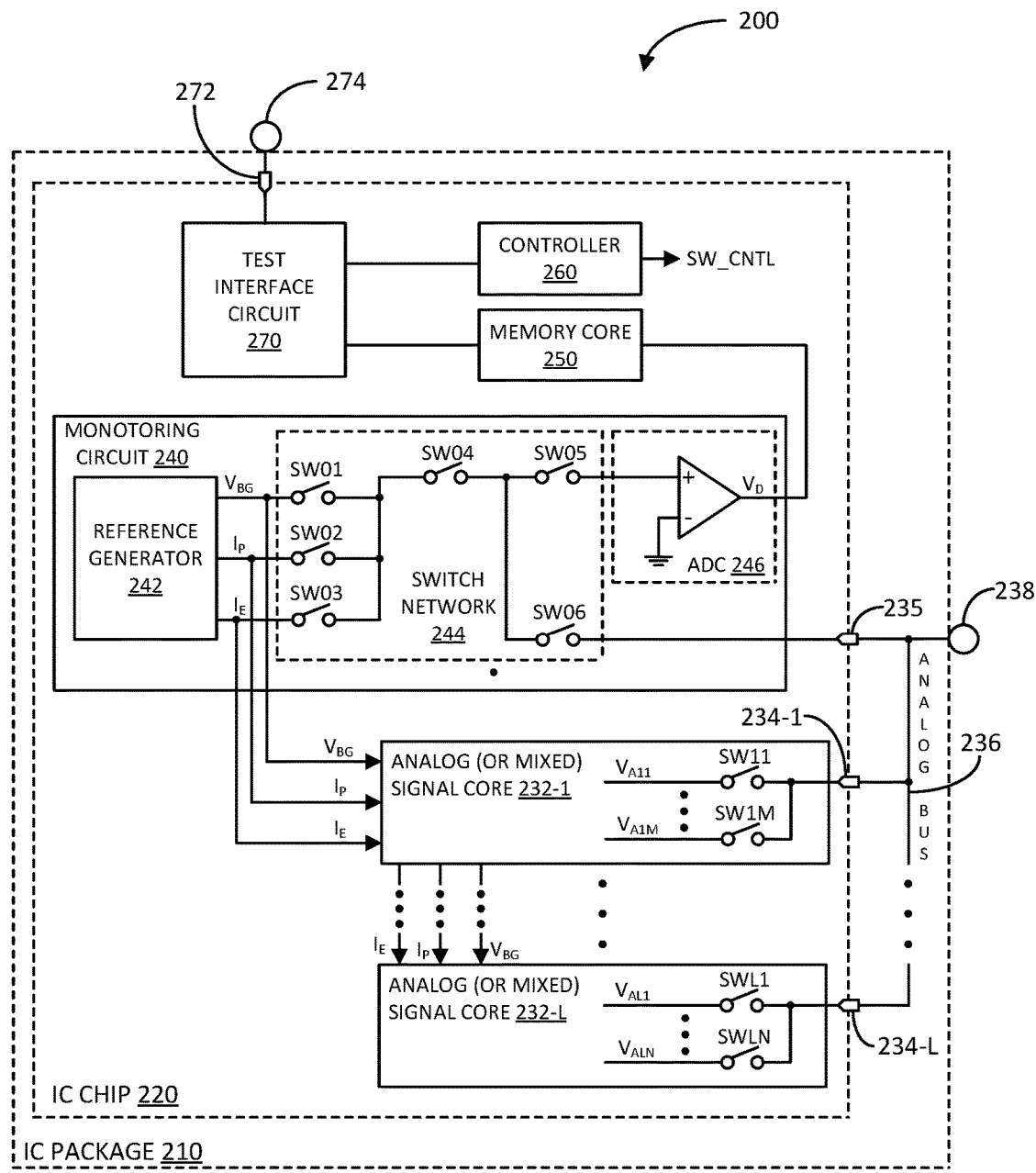
FIG. 2A illustrates a diagram of an exemplary IC that includes an on-chip analog signal monitoring circuit in accordance with another aspect of the disclosure.

FIG. 2A illustrates a diagram of an exemplary IC 200 that includes an on-chip analog signal monitoring circuit in accordance with another aspect of the disclosure. In particular, the IC 200 includes an IC chip 220 situated within an IC package 210. The IC chip 220 may include one or more analog or mixed signal cores 232-1 to 232-L, where L is an integer of one or more. As an example, the cores 232-1 to 232-L may be a UFS PHY, PCIe PHY, and USB PHY cores.

Each of the cores 232-1 to 232-L is configured to generate a set of analog signals for which there is a desire to monitor for configuring, optimizing, robustness, diagnostic, debugging, testing and/or other purposes. For example, the analog or mixed signal core 232-1 may generate analog signals $V_{A11}$ to $V_{A1M}$, where M is an integer of one or more. Similarly, the analog or mixed signal core 232-L may generate analog signals $V_{AL1}$ to $V_{ALN}$, where N is an integer of one or more.

The analog or mixed signal cores 232-1 to 232-L include switches for selectively outputting the analog signals or voltages to be monitored. For example, core 232-1 includes a set of switches SW11 to SW1M for selectively outputting one of the analog signals or voltages $V_{A11}$ to $V_{A1M}$ to a solder bump 234-1 of the IC chip 220. Similarly, core 232-L includes a set of switches SWL1 to SWLM for selectively outputting one of the analog signals or voltages $V_{AL1}$ to $V_{ALN}$ to a solder bump 234-L of the IC chip 220.

The solder bumps 234-1 to 234-L may be electrically coupled to an analog bus 236, which at least a portion of it may be implemented as an interconnect of the IC package 210. The analog bus 236 may be electrically coupled to at least one ball 238 of a set of BGA balls of the IC package 210. A test equipment may be coupled to the at least one BGA ball 238 for testing and other related purposes as discussed herein. Thus, the at least one BGA ball 238 may serve as an analog ATP.

The IC chip 220 further includes an on-chip analog signal monitoring circuit 240. For reducing the complexity and saving area of the IC chip, the on-chip analog signal monitoring circuit 240 may be implemented in an already existing core, such as in a reference generation core. The reference generation core may be a core that generates precise reference voltages and/or currents.

Accordingly, the on-chip analog signal monitoring circuit 240 includes a reference generator 242 configured to generate a set of one or more reference signals. For example, the reference generator 242 may generate a reference voltage $V_{BG}$ (e.g., a bandgap voltage), a first reference current (e.g., a reverse-proportional-to-resistor current $I_P$), and a second reference current (e.g., a constant current $I_E$). As illustrated, the reference generator 242 may supply one or more of the reference signals, $V_{BG}$, $I_P$, and $I_E$, to one or more of the analog or mixed signal cores 232-1 to 232-L via impedance-calibrated electrical paths within the IC chip 220. The cores 232-1 to 232-L each uses any one or more of the reference signals $V_{BG}$, $I_P$, and $I_E$, to perform its designed operation.

The on-chip analog signal monitoring circuit 240 also includes a switching network 244 and an analog-to-digital converter (ADC) 246. The switching network 244, in turn, includes a set of switches SW01 to SW06. A subset of the switches SW01 to SW03 is coupled between outputs (for generating $V_{BG}$, $I_P$, and $I_E$) of the reference generator 242 and switch SW04, respectively. Switch SW05 is coupled between switch SW04 and an input of the ADC 246. Switch SW06 is coupled between switch SW04 and a solder bump 235 of the IC chip 220. The solder bump 235 is, in turn, coupled to the analog bus 236 and the BGA ball 238.

The IC chip 220 further includes a memory core 250 and a controller 260 coupled to a test interface circuit 270. The memory core 250 is configured to store the digitized analog voltage $V_D$ generated by the ADC 246 for subsequent external access by a test equipment via the test interface circuit 270, at least one solder bump 272, and at least one solder ball 274. The controller 260 may be configured to generate a switch control signal SW_CNTL for controlling the states of the various switches described herein, such as switches SW01 to SW06, SW11 to SW1M to SWL1 to SWLN. In this regard, the controller 260 may receive an external test configuration signal from the test equipment, for example, via the at least one BGA ball 274, the at least one solder bump 272, and the test interface circuit 270, for setting up the desired test environment for monitoring the analog signals.

In operation, the ADC 246 may be calibrated using a selected one of the reference signals $V_{BG}$, $I_P$, and $I_E$. For instance, if the ADC 246 is a voltage-mode ADC, the ADC may be calibrated using the bandgap voltage reference signal $V_{BG}$. Alternatively, the voltage-mode ADC 246 may also be calibrated using any one of the current reference signals $I_P$ and $I_E$ by including at least one resistor for converting the current reference signal to a voltage; the converted voltage being used to calibrated the ADC 246. If the ADC 246 is a current-mode ADC, the ADC may be calibrated directly using any one of the current reference signals $I_P$ and $I_E$.

In this regard, the controller 260 may receive a test configuration signal for calibrating the ADC 246 using a selected reference. In response, the controller 260 generates the switch control signal SW_CNTL to configure the switches of the switch network 244 for calibrating the ADC 246 using a selected one of the reference signals. For example, if the ADC 246 is to be calibrated using the reference signal $V_{BG}$, the controller 260 generates the switch control signal SW_CNTL to close switches SW01, SW04, and SW05, and open switches SW02, SW03, and SW06. In this configuration, the reference signal $V_{BG}$ is provided to the ADC 246 via switches SW01, SW04, and SW05. The other switches SW02, SW03, and SW06 are opened to prevent leakage of and interference of the selected reference signal $V_{BG}$.

Similarly, if the ADC 246 is to be calibrated using the reference signal $I_P$, the controller 260 generates the switch control signal SW_CNTL to close switches SW02, SW04, and SW05, and open switches SW01, SW03, and SW06. In this configuration, the reference signal $I_P$ is provided to the ADC 246 via switches SW02, SW04, and SW05. The other switches SW01, SW03, and SW06 are opened to prevent leakage of and interference of the selected reference signal $I_P$.

In a like manner, if the ADC 246 is to be calibrated using the reference signal $I_E$, the controller 260 generates the switch control signal SW_CNTL to close switches SW03, SW04, and SW05, and open switches SW01, SW02, and SW06. In this configuration, the reference signal $I_P$ is provided to the ADC 246 via switches SW03, SW04, and SW05. The other switches SW01, SW02, and SW06 are opened to prevent leakage of and interference of the selected reference signal $I_P$.

The ADC 246 may also be calibrated using an external reference signal. The external reference signal may be applied to the ADC 246 via the BGA ball 238. In this regard, the controller 260 generates the switch control signal SW_CNTL to configure the switches of the switch network 244 for calibrating the ADC 246 using an external reference signal. For example, the controller 260 generates the switch control signal SW_CNTL to close switches SW05 and SW06, and open switches SW01 to SW04. Additionally, in this configuration, the controller 260 may generate the switch control signal to open all switches SW11 to SW1M to SWL1 to SWLN in the analog or mixed signal cores 232-1 to 232-L so as not to interfere with the external reference signal. Thus, the external reference signal is applied to the ADC 246 via the BGA ball 238, analog bus 236, solder bump 235, and switches SW06 and SW05. Similarly, the switches SW01 to SW04 are opened so that the internal reference signals $V_{BG}$, $I_P$, and $I_E$ do not interfere with the external reference signal being applied to the ADC 246.

For digitizing a selected analog signal from one of the analog or mixed signal cores 232-1 to 232-L, the controller 260 configures the switches based on a test configuration command received via the test interface circuit 270 to route a selected one of analog voltages to the ADC 246 for digitizing. In this regard, the controller 260 generates the switch control signal SW_CNTL to close one of the switches SW11 to SWLN corresponding to the analog voltage to be digitized, and open the remaining switches SW11 to SWLN. Additionally, in accordance with this test configuration, the controller 260 generates the switch control signal SW_CNTL to close switches SW05 and SW06 so that the selected analog voltage is routed to the ADC 246 via the selected one of the switches SW11 to SWLN, switch SW06, and switch SW05. Further, in accordance with this configuration, the controller 260 generates the switch control signal SW_CNTL to open at least switch SW04 and optionally switches SW01 to SW03 so that the internal reference signals $V_{BG}$, $I_P$, and $I_E$ do not interfere with selected analog voltage being applied to the ADC 246.

The ADC 246 then converts the selected analog signal to a digital signal $V_D$ for storage in memory 250. The process may be repeated for digitizing other analog signals $V_{A11}$ to $V_{ALN}$ as desired in accordance with the test configuration commands received by the controller 260 via the test interface circuit 270. The memory core 250 may subsequently receive a read out command to output one or more digitized analog voltages $V_D$ to an external (e.g., software-based) diagnostic or test equipment via the test interface circuit 270.

Based on a received test configuration command, the controller 260 may also cause a selected one of the analog voltages $V_{A11}$ to $V_{ALN}$ to be routed to the analog ATP 238 for performing a direct monitoring of the analog signal by an external test equipment. In this regard, the controller 260, based on a test configuration command received via the test interface circuit 270, generates the switch control signal SW_CNTL to close a selected one of the switches SW11 to SWLN corresponding to the selected analog voltage, and open the remaining switches SW11 to SWLN. Additionally, according to this test configuration, the controller 260 generates the switch control signal SW_CNTL to open switch SW06 so that the switch network 244 does not affect the routing of the selected analog signal to the analog ATP 238.

Thus, the on-chip analog signal monitoring circuit 240 facilitates the monitoring and digitizing of analog signals from analog or mixed signal cores, and subsequent storage of the digitized signals. For testing and/or diagnostic purposes, a field or development engineer may connect a software-based test equipment to the test interface circuit 270 via the at least one bump and the at least one BGA ball 274 and read out all of the desired digitized analog voltages from the memory core 250. The test equipment may then analyze the data to assist the engineer in debugging and/or optimizing the IC 200. Alternatively, or in addition to, the field or development engineer may connect a test equipment to the analog ATP 238 to directly monitor the analog signals if desired to debug and/or optimize the IC 200.

Figure 2B:
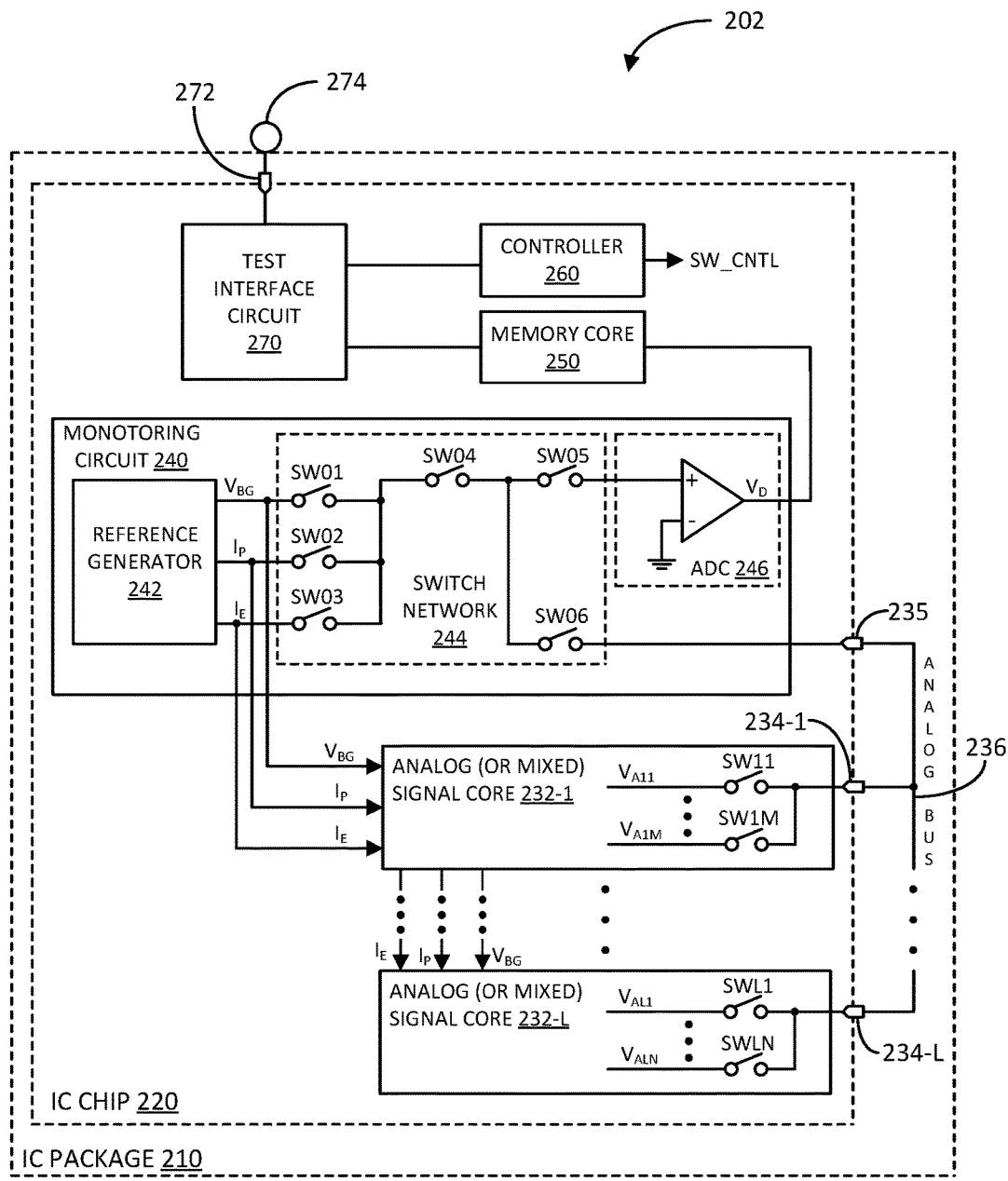
FIG. 2B illustrates a block diagram of another exemplary IC in accordance with another aspect of the disclosure.

FIG. 2B illustrates a block diagram of another exemplary IC 202 in accordance with another aspect of the disclosure. The IC 202 is a variant of IC 200 and includes many similar elements as indicated by the same reference numbers. As previous discussed, since all of the digitized analog signals may be monitored by an external test equipment via the test interface circuit 270, there may not be a need for the analog ATP 238. Accordingly, the IC 202 may optionally be configured to eliminate the analog ATP 238. This facilitates the IC package 210 to be made smaller or to facilitate the use of the area that was previously intended for analog ATP 238 to be used for other purposes.

Figure 2C:
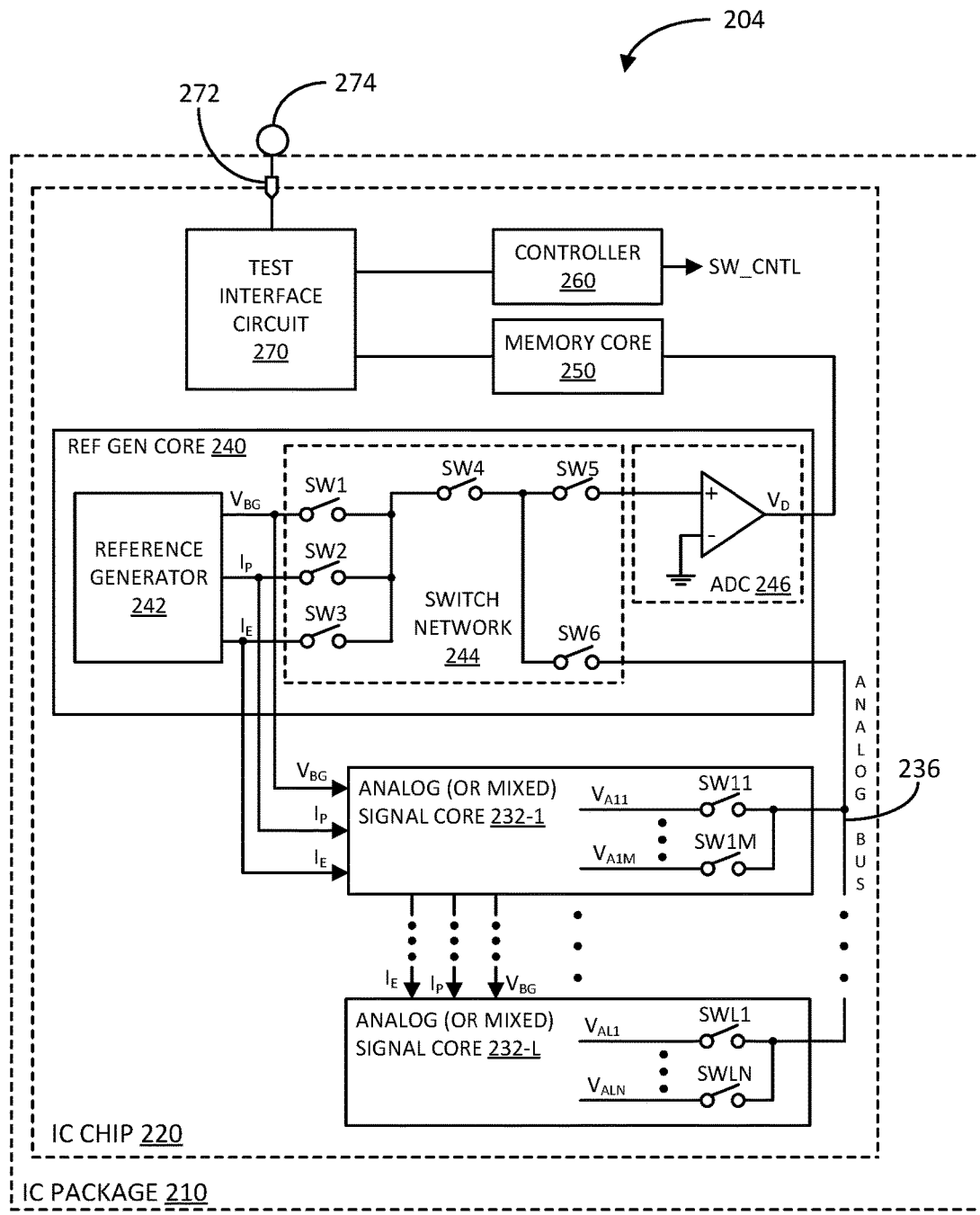
FIG. 2C illustrates a block diagram of yet another exemplary IC in accordance with another aspect of the disclosure.

FIG. 2C illustrates a block diagram of yet another exemplary IC 204 in accordance with another aspect of the disclosure. The IC 204 is a variant of IC 202 and includes many similar elements as indicated by the same reference numbers. As previous discussed, since there may not be a need for the analog ATP 238, the analog bus 236 need not be implemented as package interconnect. Accordingly, the IC 204 may optionally be configured to implement the analog bus 236 inside the IC chip 220. Again, this may further facilitate the IC package 210 to be made smaller or to facilitate the use of the area that was previously intended for the analog bus interconnect 236 to be used for other purposes.

Figure 3:
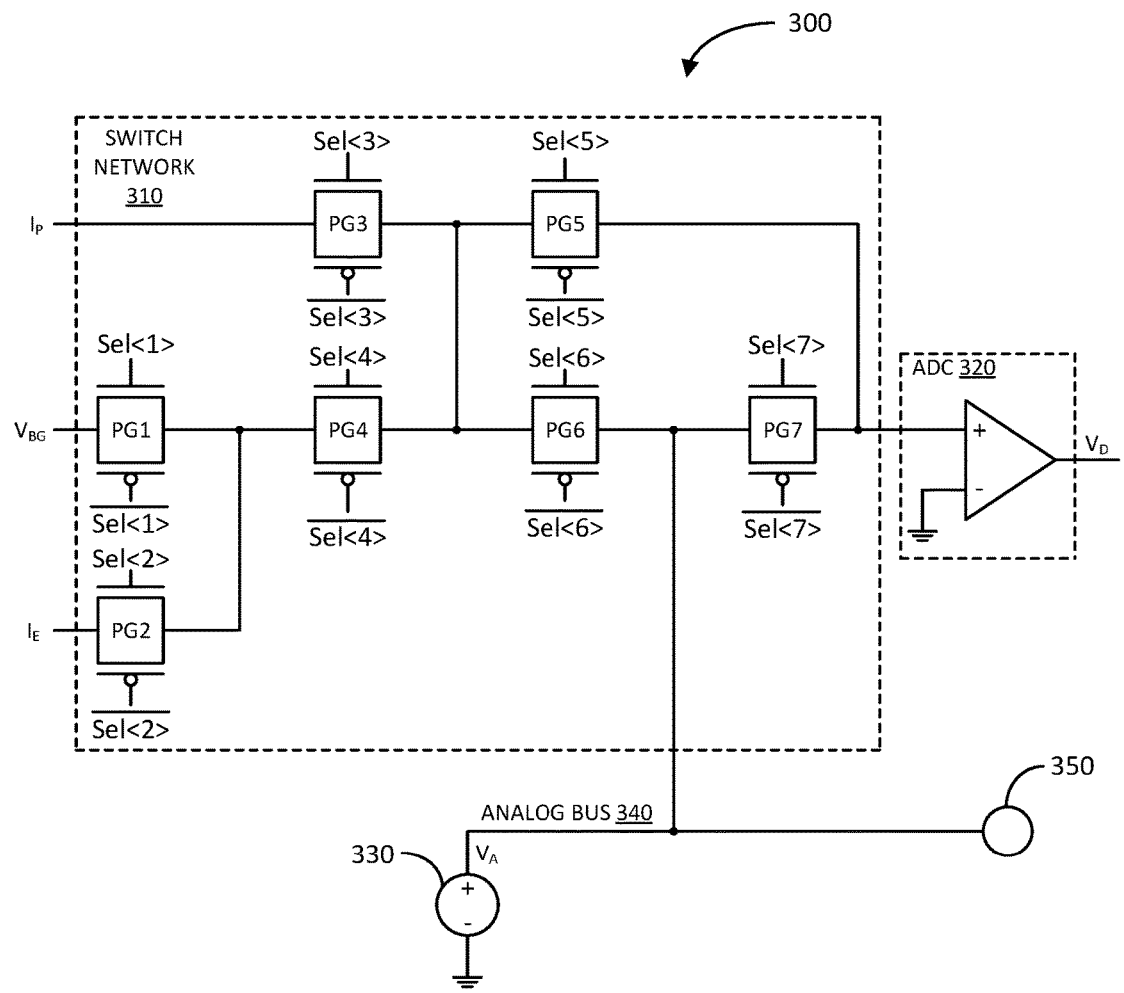
FIG. 3 illustrates a schematic diagram of another exemplary on-chip analog signal monitoring circuit in accordance with another aspect of the disclosure.

FIG. 3 illustrates a schematic diagram of another exemplary on-chip analog signal monitoring circuit 300 in accordance with another aspect of the disclosure. The monitoring circuit 300 may be an exemplary implementation of the monitoring circuit 240 previously discussed. The monitoring circuit 300 includes a switching network 310 with pass gates PG1 to PG7, and an ADC 320. Control signals Sel<1> to Sel<7> set the states (on or off) of the pass gates PG1 to PG7, respectively. The control signals Sel<1> to Sel<7> may be generated as the switch control signal SW_CNTL by controller 260.

In this example, there are three (3) available reference signals $V_{BG}$, $I_E$, and $I_P$. The bandgap reference signal $V_{BG}$ is applied to an input of pass gate PG1. Control signal Sel<1> and its complementary $\overline{Sel<1>}$ are applied to the gate and complementary gate of pass gate PG1. The constant current reference signal $I_E$ is applied to an input of pass gate PG2. Control signal Sel<2> and its complementary $\overline{Sel<2>}$ are applied to the gate and complementary gate of pass gate PG2. And, the reverse-proportional-to-resistor current $I_P$ is applied to an input of pass gate PG3. Control signal Sel<3> and its complementary $\overline{Sel<3>}$ are applied to the gate and complementary gate of pass gate PG3.

Pass gates PG1 and PG2 include outputs coupled to an input of pass gate PG4. Control signal Sel<4> and its complementary $\overline{Sel<4>}$ are applied to the gate and complementary gate of pass gate PG4. Pass gates PG3 and PG4 include outputs coupled to inputs of pass gates PG5 and PG6. Control signal Sel<5> and its complementary $\overline{Sel<5>}$ are applied to the gate and complementary gate of pass gate PG5. Control signal Sel<6> and its complementary $\overline{Sel<6>}$ are applied to the gate and complementary gate of pass gate PG6.

Pass gate PG5 includes an output coupled to an input of the ADC 320. Pass gate PG6 includes an output coupled to an analog signal bus 340 and an input of pass gate PG7. Control signal Sel<7> and its complementary $\overline{Sel<7>}$ are applied to the gate and complementary gate of pass gate PG7. Pass gate PG7 includes an output coupled to the input of the ADC 320.

A source 320 of an analog signal $V_A$ to be monitored (e.g., an analog or mixed signal core) is coupled to the analog signal bus 340. And, optionally, a BGA ball 350 may be coupled to the analog signal bus 340. As discussed in more detail below, the ADC 320 is configured to digitize the analog voltage $V_A$ to generate a digitized signal $V_D$.

In operation, to send a selected internal reference signal (e.g., $V_{BG}$, $I_E$, or $I_P$) to the ADC 320 for calibration purposes, the control signal Sel<5> is set logically high to turn on pass gate PG5, and control signals Sel<6> and Sel<7> are set logically low to turn off pass gates PG6 and PG7. Further, the control signal (a selected one of Sel<1> to Sel<3>) corresponding to the selected reference signal (a selected one of $V_{BG}$, $I_E$, and $I_P$) is set logically high to turn on the corresponding pass gate (a selected one of pass gates PG1, PG2 and PG3). Further, the control signals (the unselected two of Sel<1> to Sel<3>) corresponding to the unselected reference signals (the unselected two of $V_{BG}$, $I_E$, and $I_P$) are set logically low to turn off the corresponding pass gates (the unselected two of pass gates PG1, PG2 and PG3). If one of the selected reference signal is $V_{BG}$ or $I_E$, the control signal Sel<4> is set logically high to turn on pass gate PG4. Otherwise, control signal Sel<4> may be set logically low to turn off pass gate PG4 if the selected reference signal is $I_P$.

Thus, the selected reference signal is routed to the ADC 320 via the selected pass gate (the selected one of pass gates PG1, PG2 and PG3), pass gate PG4 (if the selected reference signal is $V_{BG}$ or $I_E$) and pass gate PG5. The pass gates PG6 and PG7 are turned off to prevent the selected reference signal from leaking out to the analog bus 340 and prevent any signal or noise residing in the analog bus from affecting the routing of the selected reference signal to the ADC 320.

To send the analog signal $V_A$ to the ADC 320 for digitizing, control signal Sel<7> is set logically high to turn on pass gate PG7, and the remaining control signals Sel<1> to Sel<6> may be set logically low to turn off pass gates PG1 to PG6, respectively. Thus, the analog signal $V_A$ is routed to the ADC 320 via pass gate PG7, and the other pass gates PG1 to PG7 are turned off to prevent leakage and interference of the analog signal $V_A$ as it is routed to the ADC 320.

To send a selected reference (a selected one of $V_{BG}$, $I_E$, and $I_P$) to the BGA ball 350, the control signal (a selected one of SEL<1> to SEL<3>) corresponding to the selected reference signal is set logically high to turn on the corresponding pass gate (a selected one of pass gates PG1, PG2, and PG3). If one of the selected reference signal is $V_{BG}$ or $I_E$, the control signal Sel<4> is set logically high to turn on pass gate PG4. Otherwise, the control signal Sel<4> may be set logically low to turn off pass gate PG4 if the selected reference signal is $I_P$. The control signal Sel<6> is set logically high to turn on pass gate PG6. The control signals Sel<5> and Sel<6> may be set logically low to turn off pass gates PG5 and PG7.

Thus, the selected reference signal is sent to the BGA ball 350 via the selected pass gate (the selected one of pass gates PG1, PG2 and PG3), pass gate PG4 (if the selected reference signal is $V_{BG}$ or $I_E$) and pass gate PG6. Pass gates PG5 and PG7 are turned off to prevent leakage and interference of the selected reference signal as it is routed to the BGA ball 350.

To disconnect the monitoring circuit 300 from the analog bus 340, control signals Sel<6> and Sel<7> are set logically low to turn off pass gates PG6 and PG7.

Figure 4:
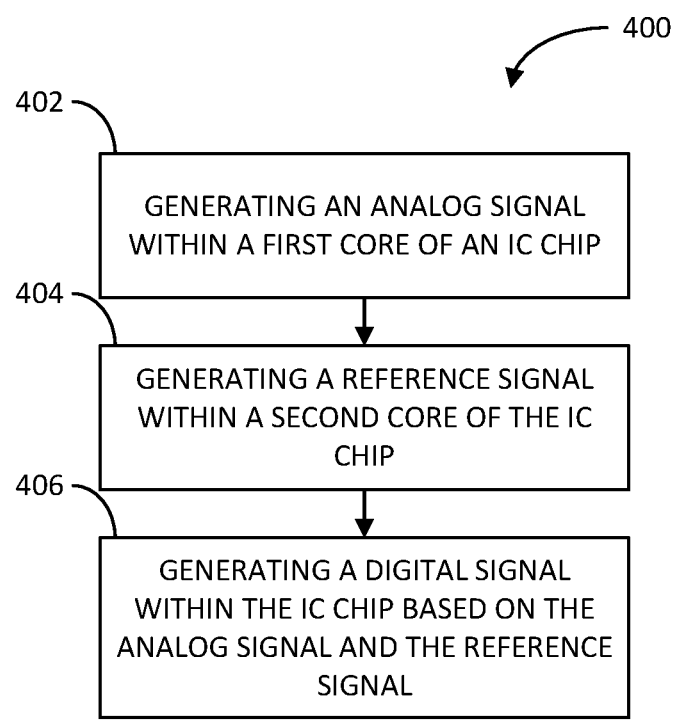
FIG. 4 illustrates a flow diagram of an exemplary method of monitoring an analog signal in accordance with another aspect of the disclosure.

FIG. 4 illustrates a flow diagram of an exemplary method 400 of monitoring an analog signal in accordance with another aspect of the disclosure. The method 400 includes generating an analog signal within a first core of an IC chip (block 402). An example of a means for generating an analog signal includes any circuitry within any one of the analog or mixed signal cores 234-1 to 234-L of the IC chip 220.

The method 400 further includes generating a reference signal within a second core of the IC chip (block 404). An example of a means for generating a reference signal within a second core of the IC chip includes the reference generator 242 that generates any one of the reference signals $V_{BG}$, $I_P$, and $I_E$ within a reference generating core of the IC chip 220.

The method 400 also includes generating a digital signal within the IC chip based on the analog signal and the reference signal (block 406). An example of a means for generating a digital signal within the IC chip based on the analog signal and the reference signal includes the analog-to-digital converter (ADC) 246.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
   an integrated circuit (IC) chip comprising:
      a first core configured to generate a first set of one or more analog signals;
      a reference generator configured to generate a set of one or more reference signals;
      an analog-to-digital converter (ADC) configured to generate a digital signal based on a selected one of the first set of one or more analog signals; and
   a switching network configured to:
      selectively route a selected one of the set of one or more reference signals to the ADC for calibrating the ADC; and
      selectively route the selected one of the first set of one or more analog signals to the ADC for generating the digital signal.

2. The apparatus of claim 1, wherein the reference generator, the switching network, and the ADC are implemented in a second core of the IC chip.

3. The apparatus of claim 1, wherein at least one of the set of one or more reference signals are applied to the first core.

4. The apparatus of claim 1, wherein the IC chip further comprises a memory core configured to store the digital signal.

5. The apparatus of claim 4, further comprising a test interface circuit coupled to the ADC and the memory core.

6. The apparatus of claim 5, wherein the test interface circuit is implemented in the IC chip.

7. The apparatus of claim 5, further comprising an IC package, wherein the IC chip is enclosed within the IC package.

8. The apparatus of claim 7, wherein the IC package further comprises at least one ball grid array (BGA) ball coupled to the test interface circuit, wherein the at least one BGA ball is configured to be coupled to a test equipment for outputting the digital signal for analysis purposes.

9. The apparatus of claim 1, further comprising a controller configured to generate a control signal for controlling the switching network to route the selected one of the one or more reference signals to the ADC and the selected one of the one or more analog signals to the ADC.

10. The apparatus of claim 1, wherein the IC chip further comprises a second core configured to generate a second set of one or more analog signals; and further comprising an analog bus coupled to the first and second cores and to the switching network, wherein the analog bus and the switching network are configured to route a selected one of the first set of one or more analog signals or the second set of one or more analog signals to the ADC.

11. The apparatus of claim 10, wherein the analog bus is implemented within the IC chip.

12. The apparatus of claim 11, further comprising an IC package, wherein the IC chip is enclosed within the IC package.

13. The apparatus of claim 12, wherein the IC package further comprises at least one ball grid array (BGA) ball coupled to the analog bus.

14. The apparatus of claim 13, wherein the at least one BGA ball is configured to be coupled to a test equipment for outputting the selected one of the analog signal from the first set of one or more analog signals or the second set of one or more analog signals for analysis purposes.

15. The apparatus of claim 13, wherein the at least one BGA ball is configured to be coupled to a source of an external reference signal, wherein the analog bus and the switching network is configured to route the external reference signal to the ADC for calibration of the ADC.

16. The apparatus of claim 12, wherein the analog bus is implemented as an interconnect of the IC package.

17. A method, comprising:
   generating an analog signal within a first core of an integrated circuit (IC) chip;
   generating a reference signal within a second core of the IC chip; and
   generating a digital signal within the IC chip based on the analog signal and the reference signal.

18. The method of claim 17, wherein generating the digital signal occurs within the second core of the IC chip.

19. The method of claim 17, further comprising storing the digital signal within a memory core of the IC.

20. The method of claim 19, further comprising routing the digital signal from the memory core of the IC to an external test equipment.

21. The method of claim 17, further comprising routing the analog signal from the second core of the IC to an external test equipment.

22. The method of claim 17, further comprising:
   generating a second analog signal within a third core of the IC;
   generating a second digital signal within the IC chip based on the second analog signal and the reference signal or another reference signal; and
   storing the first digital signal and second digital signal in a memory core within the IC.

23. The method of claim 22, further comprising routing the first digital signal and the second digital signal from the memory core of the IC to an external test equipment.

24. An apparatus, comprising:
   means for generating an analog signal within a first core of an integrated circuit (IC) chip;
   means for generating a reference signal within a second core of the IC chip; and
   means for generating a digital signal within the IC chip based on the analog signal and the reference signal.

25. The apparatus of claim 24, wherein the means for generating the digital signal is implemented within the second core of the IC chip.

26. The apparatus of claim 24, further comprising means for storing the digital signal within the IC.

27. The apparatus of claim 24, further comprising means for routing the digital signal from the means for storing to an external test equipment.

28. The apparatus of claim 24, further comprising means for routing the analog signal from the second core of the IC to an external test equipment.

29. The apparatus of claim 24, further comprising:
   means for generating a second analog signal within a third core of the IC;
   means for generating a second digital signal within the IC chip based on the second analog signal and the reference signal or another reference signal; and
   means for storing the first digital signal and second digital signal in a memory core within the IC.

30. The method of claim 29, further comprising means for routing the first digital signal and the second digital signal from the memory core of the IC to an external test equipment.

* * * * *